United States Patent
Kamiyama

(10) Patent No.: US 10,946,482 B2
(45) Date of Patent: Mar. 16, 2021

(54) LASER PROCESSING APPARATUS

(71) Applicant: DISCO CORPORATION, Tokyo (JP)

(72) Inventor: Haruki Kamiyama, Tokyo (JP)

(73) Assignee: DISCO CORPORATION, Tokyo (JP)

(*) Notice: Subject to any disclaimer, the term of this patent is extended or adjusted under 35 U.S.C. 154(b) by 255 days.

(21) Appl. No.: 16/113,427

(22) Filed: Aug. 27, 2018

(65) Prior Publication Data
US 2019/0061060 A1 Feb. 28, 2019

(30) Foreign Application Priority Data

Aug. 30, 2017 (JP) .............................. JP2017-165632

(51) Int. Cl.
| | |
|---|---|
| *B23K 26/364* | (2014.01) |
| *G02B 19/00* | (2006.01) |
| *G02B 26/08* | (2006.01) |
| *B23K 26/06* | (2014.01) |
| *H01L 21/78* | (2006.01) |
| *C30B 29/36* | (2006.01) |

(Continued)

(52) U.S. Cl.
CPC ........ *B23K 26/364* (2015.10); *B23K 26/0648* (2013.01); *C30B 29/36* (2013.01); *C30B 33/06* (2013.01); *G02B 19/0009* (2013.01); *G02B 19/0014* (2013.01); *G02B 19/0047* (2013.01); *G02B 26/0875* (2013.01); *H01L 21/78* (2013.01); *H01L 21/67092* (2013.01); *H01L 21/6836* (2013.01); *H01L 2221/68327* (2013.01)

(58) Field of Classification Search
CPC ............ B23K 2101/40; B23K 2103/56; B23K 26/0006; B23K 26/032; B23K 26/042; B23K 26/046; B23K 26/0622; B23K 26/0648; B23K 26/0652; B23K 26/0823; B23K 26/0853; B23K 26/364; B23K 26/53; C30B 29/36; C30B 33/06; G02B 19/0009; G02B 19/0014; G02B 19/0047; G02B 26/0875; H01L 21/67092; H01L 21/6836; H01L 21/78; H01L 2221/68327
See application file for complete search history.

(56) References Cited

U.S. PATENT DOCUMENTS 3,609,012 A * 9/1971 Street ................. G02B 19/0014
359/715
7,333,255 B2 * 2/2008 Eda ...................... B23K 26/032
359/196.1

(Continued)

FOREIGN PATENT DOCUMENTS

| JP | 10305420 A | 11/1998 |
|---|---|---|
| JP | 2002192370 A | 7/2002 |
| JP | 2016111143 A | 6/2016 |

*Primary Examiner* — Ibrahime A Abraham
*Assistant Examiner* — Frederick F Calvetti
(74) *Attorney, Agent, or Firm* — Greer Burns & Crain Ltd.

(57) ABSTRACT

A laser beam oscillated by a laser oscillator is condensed by a condenser. The condenser includes: a concave lens; a convex lens disposed at a predetermined interval from the concave lens, and disposed at a position such that aberration of a condensing point in the atmosphere is zero; and an actuator that generates an aberration at the condensing point in the atmosphere by changing the distance of the convex lens with respect to the concave lens. The actuator generates the aberration in the atmosphere such that the aberration of the condensing point is zero within a workpiece.

5 Claims, 5 Drawing Sheets

(51) Int. Cl.
*C30B 33/06* (2006.01)
*H01L 21/67* (2006.01)
*H01L 21/683* (2006.01)

(56) References Cited

U.S. PATENT DOCUMENTS

| | | | | |
|---|---|---|---|---|
| 7,742,212 | B2* | 6/2010 | Scaggs | G02B 26/101 |
| | | | | 219/121.75 |
| 8,022,332 | B2* | 9/2011 | Eda | B23K 26/032 |
| | | | | 219/121.73 |
| 8,993,924 | B2* | 3/2015 | Ryu | B23K 26/0648 |
| | | | | 219/121.72 |
| 9,283,639 | B2* | 3/2016 | Sato | H01L 33/00 |
| 9,352,414 | B2* | 5/2016 | Atsumi | B23K 26/03 |
| 9,457,424 | B2* | 10/2016 | Nakano | B23K 26/03 |
| 9,685,355 | B2* | 6/2017 | Hyakumura | H01L 21/67092 |
| 2005/0018289 | A1* | 1/2005 | Yanowitz | G03F 7/70825 |
| | | | | 359/462 |
| 2006/0228095 | A1* | 10/2006 | Eda | B23K 26/064 |
| | | | | 385/147 |
| 2006/0289410 | A1* | 12/2006 | Morita | B23K 26/04 |
| | | | | 219/121.67 |
| 2008/0029497 | A1* | 2/2008 | Eda | B23K 26/53 |
| | | | | 219/121.68 |
| 2012/0111310 | A1* | 5/2012 | Ryu | B23K 26/0869 |
| | | | | 125/30.01 |
| 2012/0125901 | A1* | 5/2012 | Chen | B23K 26/0823 |
| | | | | 219/121.67 |
| 2015/0185492 | A1* | 7/2015 | Nagano | B23K 26/0665 |
| | | | | 359/641 |
| 2016/0368085 | A1* | 12/2016 | Atsumi | B23K 26/40 |
| 2017/0158551 | A1* | 6/2017 | Bookbinder | B23K 26/50 |
| 2019/0084089 | A1* | 3/2019 | Igasaki | G02B 5/08 |
| 2020/0164463 | A1* | 5/2020 | Shibazaki | B23K 26/0344 |

* cited by examiner

LASER PROCESSING APPARATUS

BACKGROUND OF THE INVENTION

Field of the Invention

The present invention relates to a laser processing apparatus for performing processing within a workpiece.

Description of the Related Art

A wafer in which a plurality of devices such as integrated circuits (ICs), large-scale integrated circuits (LSIs), light emitting diodes (LEDs), surface acoustic wave (SAW) filters, or the like are demarcated by a plurality of planned dividing lines intersecting each other, and are formed on an upper surface of a Si (silicon) substrate, a SiC (silicon carbide) substrate, an $Al_2O_3$ (sapphire) substrate, a $LiTaO_3$ (lithium tantalate) substrate, or the like is divided into individual device chips by a dicing apparatus and a laser processing apparatus. Each of the divided device chips is used in an electric apparatus such as a mobile telephone, a personal computer, or the like.

There are laser processing apparatuses of the following type (1) or (2).

(1) A type that positions a condensing point of a laser beam of a wavelength absorbable by a wafer at a planned dividing line, irradiates the wafer with the laser beam, and forms a groove on the planned dividing line by ablation processing to divide the wafer into individual device chips (see Japanese Patent Laid-Open No. 1998-305420, for example).

(2) A type that positions a condensing point of a laser beam of a wavelength transmissible through a wafer inside a planned dividing line, irradiates the wafer with the laser beam, and forms a modified layer within the wafer along the planned dividing line to divide the wafer into individual device chips (see Japanese Patent No. 3408805, for example).

SUMMARY OF THE INVENTION

However, an excellent modified layer is not necessarily formed even when a condenser such that aberration of the condensing point of a laser beam is zero in the atmosphere is used, the condensing point is positioned within the workpiece, and the wafer is irradiated with the laser beam. Such a problem can occur also in a case of positioning the condensing point in a region at a depth corresponding to the thickness of a wafer to be produced from an end surface of a SiC ingot, irradiating the SiC ingot with a laser beam, and forming a peeling layer in which SiC is separated into Si and C and cracks extend along a c-plane (see Japanese Patent Laid-Open No. 2016-111143, for example).

It is accordingly an object of the present invention to provide a laser processing apparatus that can perform excellent processing within a workpiece.

In accordance with an aspect of the present invention, there is provided a laser processing apparatus including: a chuck table configured to hold a workpiece; a laser irradiating unit configured to perform processing by positioning, within the workpiece, a condensing point of a laser beam of a wavelength transmissible through the workpiece held by the chuck table, and irradiating the workpiece with the laser beam; and a processing feed unit configured to perform processing feed of the chuck table and the laser irradiating unit relative to each other; the laser irradiating unit including a laser oscillator configured to oscillate the laser beam and a condenser configured to condense the laser beam oscillated by the laser oscillator; the condenser including a concave lens, a convex lens disposed at a predetermined interval from the concave lens, and disposed at a position such that aberration of the condensing point is zero in an atmosphere, and an actuator configured to generate an aberration at the condensing point in the atmosphere by changing a distance of the convex lens with respect to the concave lens; the actuator generating the aberration in the atmosphere such that the aberration of the condensing point is zero within the workpiece.

Optically, the aberration of the condensing point does not become completely zero. However, a zero aberration of the condensing point in the present specification means that the aberration is infinitely small to such a degree that laser processing is performed excellently, and can be considered to be substantially zero.

Preferably, the actuator is formed by a piezoelectric element.

According to the present invention, the laser irradiating unit includes the laser oscillator configured to oscillate the laser beam, and the condenser configured to condense the laser beam oscillated by the laser oscillator. The condenser includes the concave lens, the convex lens disposed at a predetermined interval from the concave lens, and disposed at a position such that the aberration of the condensing point is zero in the atmosphere, and the actuator configured to generate an aberration at the condensing point in the atmosphere by changing the distance of the convex lens with respect to the concave lens. The actuator is configured to generate the aberration in the atmosphere such that the aberration of the condensing point is zero within the workpiece. Excellent processing can therefore be performed within the workpiece.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of a laser processing apparatus configured according to the present invention will hereinafter be described with reference to the drawings. A laser processing apparatus 2 depicted in FIG. 1 includes: a holding unit 4 that holds a workpiece; a laser irradiating unit 6 that performs processing by positioning, within the workpiece, the condensing point of a laser beam of a wavelength transmissible through the workpiece held by the holding unit 4, and irradiating the workpiece with a laser beam; and a processing feed unit 8 that performs processing feed of the holding unit 4 and the laser irradiating unit 6 relative to each other.

Figure 1:
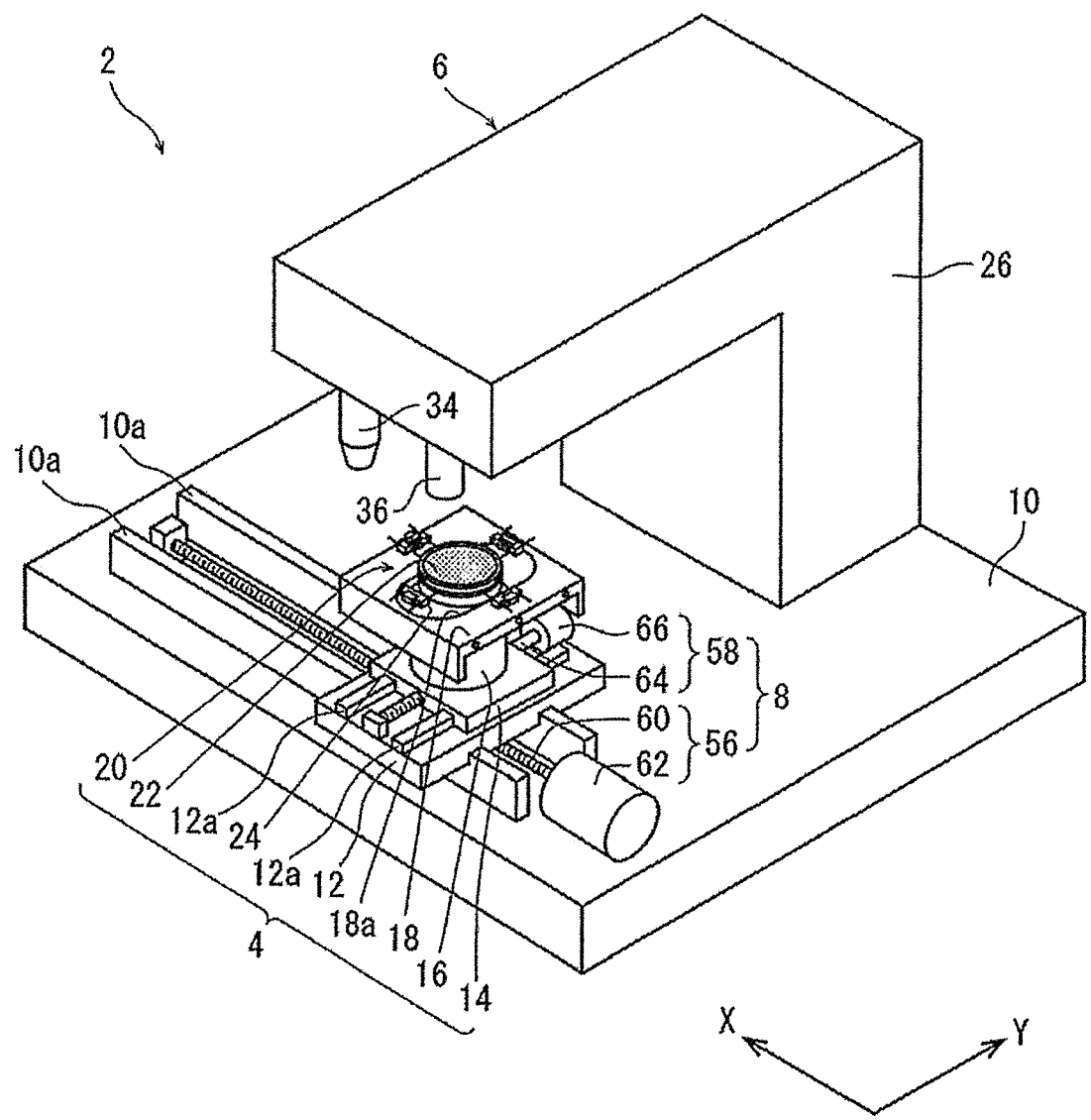
FIG. 1 is a perspective view of a laser processing apparatus.

As depicted in FIG. 1, the holding unit 4 includes: an X-axis direction movable plate 12 mounted on a base 10 so as to be movable in an X-axis direction; a Y-axis direction movable plate 14 mounted on the X-axis direction movable plate 12 so as to be movable in a Y-axis direction; a column 16 fixed to an upper surface of the Y-axis direction movable plate 14; and a cover plate 18 fixed to an upper end of the column 16. An elongated hole 18a extending in the Y-axis direction is formed in the cover plate 18. A chuck table 20 extending upward through the elongated hole 18a is rotatably mounted on the upper end of the column 16. A porous suction chuck 22 connected to suction means (not depicted) is disposed on an upper surface of the chuck table 20. The chuck table 20 can suck and hold the workpiece mounted on an upper surface of the suction chuck 22 by generating a suction force on the upper surface of the suction chuck 22 by the suction means. In addition, a plurality of clamps 24 are arranged at intervals in a circumferential direction around the periphery of the chuck table 20. Incidentally, the X-axis direction is a direction indicated by an arrow X in FIG. 1, and the Y-axis direction is a direction indicated by an arrow Y in FIG. 1 and orthogonal to the X-axis direction. A plane defined by the X-axis direction and the Y-axis direction is substantially horizontal.

Figure 2:
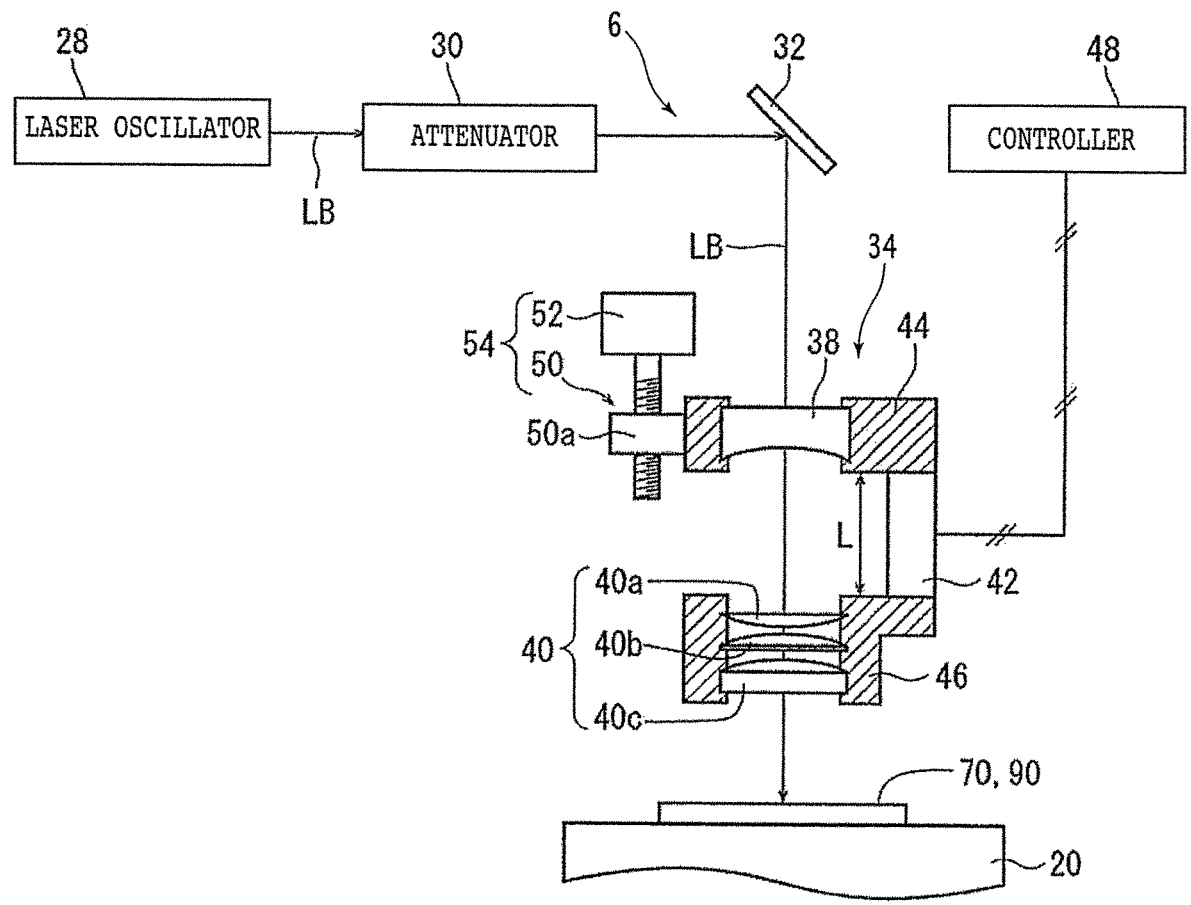
FIG. 2 is a block diagram of a laser irradiating unit depicted in FIG. 1.

The laser irradiating unit 6 will be described with reference to FIG. 1 and FIG. 2. As depicted in FIG. 1, the laser irradiating unit 6 includes a frame body 26 that extends upward from an upper surface of the base 10 and then extends substantially horizontally. As depicted in FIG. 2, arranged within the frame body 26 are: a laser oscillator 28 that oscillates a pulsed laser beam LB of a wavelength transmissible through the workpiece; an attenuator 30 that adjusts the power of the pulsed laser beam LB oscillated by the laser oscillator 28; and a mirror 32 that converts the optical path of the pulsed laser beam LB adjusted in power by the attenuator 30. In addition, as depicted in FIG. 1, a condenser 34 that condenses the pulsed laser beam LB whose optical path is converted by the mirror 32 and an imaging unit 36 for imaging the workpiece held on the chuck table 20 and detecting a region to be laser-processed are mounted on an undersurface of an front end of the frame body 26 so as to be spaced from each other in the X-axis direction.

The condenser 34 will be described with reference to FIG. 2. The condenser 34 includes: a concave lens 38; a convex lens 40 disposed at a predetermined interval from the concave lens 38, and disposed at a position such that aberration of the condensing point of the pulsed laser beam LB is zero in the atmosphere; and an actuator 42 that generates an aberration at the condensing point in the atmosphere by changing a distance of the convex lens 40 with respect to the concave lens 38. The actuator 42 generates the aberration in the atmosphere such that the aberration of the condensing point is zero within the workpiece. The concave lens 38 is supported by a concave lens supporting portion 44 fitted to the frame body 26 so as to be raised or lowered freely. The convex lens 40 is constituted of a first convex lens 40a, a second convex lens 40b, and a third convex lens 40c arranged so as to be vertically spaced from each other. The convex lens 40 is supported by a convex lens supporting portion 46 disposed below the concave lens supporting portion 44. The actuator 42 in the present embodiment is formed by a piezoelectric element connected to a lower end of the concave lens supporting portion 44 and an upper end of the convex lens supporting portion 46.

Figure 3:
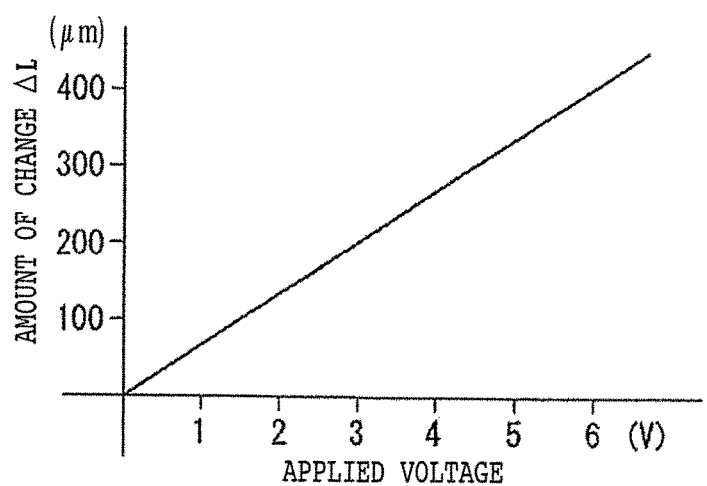
FIG. 3 is a graph depicting an example of voltage characteristics of an amount of change in vertical dimension of a piezoelectric element depicted in FIG. 2.

The piezoelectric element formed with a predetermined vertical dimension L is electrically connected to a controller 48 having a power supply. The vertical dimension L changes according to the magnitude of a voltage applied from the controller 48. A relation between the voltage applied to the piezoelectric element and an amount of change DL of the vertical dimension L of the piezoelectric element is a proportional relation as depicted in FIG. 3, for example. As depicted in FIG. 2, the concave lens supporting portion 44 is raised or lowered by a condensing point position adjusting unit 54 including a ball screw 50 extending in a vertical direction, the ball screw 50 having a nut portion 50a fixed to the concave lens supporting portion 44, and a motor 52 coupled to one end portion of the ball screw 50. This adjusts the vertical position of the condensing point of the pulsed laser beam LB condensed by the condenser 34.

In the condenser 34 of such a configuration, in a state in which no voltage is applied to the piezoelectric element of the actuator 42, the convex lens 40 is disposed with respect to the concave lens 38 such that the aberration of the condensing point is zero in the atmosphere. When a voltage is applied to the piezoelectric element of the actuator 42, on the other hand, the vertical dimension L of the piezoelectric element changes. Thus, the distance of the convex lens 40 with respect to the concave lens 38 is changed, and an aberration is generated at the condensing point of the pulsed laser beam LB in the atmosphere. Then, the condenser 34 enables the aberration to be generated in the atmosphere such that the aberration of the condensing point is zero within the workpiece by adjusting the voltage applied to the piezoelectric element as appropriate according to the index of refraction of the workpiece and the depth of a processing position.

The processing feed unit 8 will be described with reference to FIG. 1. The processing feed unit 8 includes: an X-axis direction moving unit 56 that moves the chuck table 20 in the X-axis direction with respect to the laser irradiating unit 6; a Y-axis direction moving unit 58 that moves the chuck table 20 in the Y-axis direction with respect to the laser irradiating unit 6; and a rotating unit (not depicted) that rotates the chuck table 20 with respect to the column 16. The X-axis direction moving unit 56 includes: a ball screw 60 extending in the X-axis direction on the base 10; and a motor 62 coupled to one end portion of the ball screw 60. A nut portion (not depicted) of the ball screw 60 is fixed to an undersurface of the X-axis direction movable plate 12. The X-axis direction moving unit 56 converts a rotary motion of the motor 62 into a rectilinear motion by the ball screw 60, and transmits the rectilinear motion to the X-axis direction movable plate 12 to advance or retreat the X-axis direction movable plate 12 in the X-axis direction along guide rails 10a on the base 10. The chuck table 20 is thereby moved in the X-axis direction with respect to the laser irradiating unit 6.

The Y-axis direction moving unit 58 includes: a ball screw 64 extending in the Y-axis direction on the X-axis direction movable plate 12; and a motor 66 coupled to one end portion of the ball screw 64. A nut portion (not depicted) of the ball screw 64 is fixed to an undersurface of the Y-axis direction movable plate 14. The Y-axis direction moving unit 58 converts a rotary motion of the motor 66 into a rectilinear motion by the ball screw 64, and transmits the rectilinear motion to the Y-axis direction movable plate 14 to advance or retreat the Y-axis direction movable plate 14 in the Y-axis direction along guide rails 12a on the X-axis direction movable plate 12. The chuck table 20 is thereby moved in the Y-axis direction with respect to the laser irradiating unit 6. The rotating unit has a motor (not depicted) included in the column 16. The rotating unit rotates the chuck table 20 with respect to the column 16 about an axis extending in the vertical direction.

Figure 4:
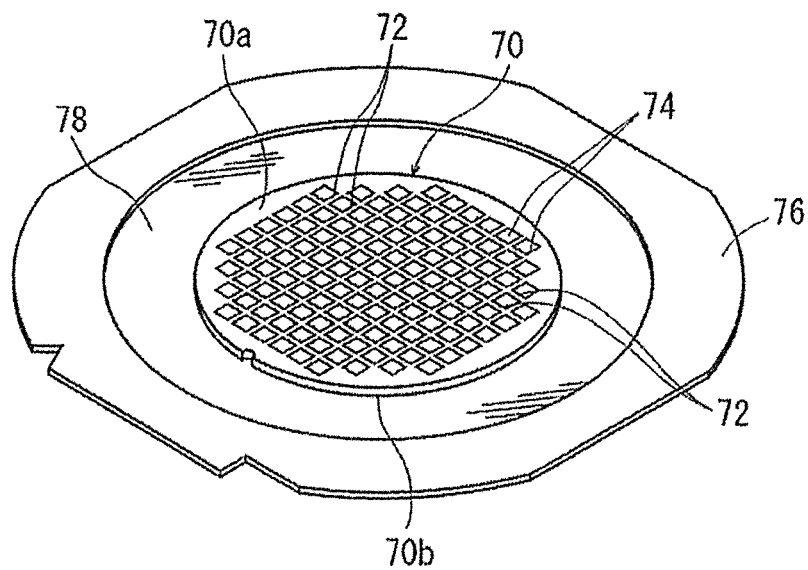
FIG. 4 is a perspective view of a wafer supported by an annular frame via a dicing tape.

FIG. 4 depicts a wafer 70 as an example of the workpiece. A top surface 70a of the disk-shaped wafer 70 that can be formed of a Si (silicon) substrate, a SiC (silicon carbide) substrate, a LiTaO$_3$ (lithium tantalate) substrate, or the like is demarcated into a plurality of rectangular regions by a plurality of planned dividing lines 72 in the form of a lattice. A device 74 is formed in each of the plurality of rectangular regions. In the present embodiment, an undersurface 70b of the wafer 70 is stuck to a dicing tape 78 whose periphery is fixed to an annular frame 76.

Description will be made of a processing method that takes the wafer 70 as the workpiece and forms a modified layer within the wafer 70 by using the laser processing apparatus 2 described above. In the present embodiment, first, the top surface 70a of the wafer 70 is directed upward, the wafer 70 is made to be stuck to the upper surface of the chuck table 20, and an outer peripheral edge portion of the annular frame 76 is fixed by the plurality of clamps 24. Next, the wafer 70 is imaged from above by the imaging unit 36. Next, by moving and rotating the chuck table 20 by the X-axis direction moving unit 56, the Y-axis direction moving unit 58, and the rotating unit on the basis of an image of the wafer 70 imaged by the imaging unit 36, the planned dividing lines 72 in the form of a lattice are aligned with the X-axis direction, and the condenser 34 is positioned above one end portion of a planned dividing line 72 aligned with the X-axis direction. Next, the distance of the convex lens 40 with respect to the concave lens 38 is changed by applying an appropriate voltage based on the index of refraction of the wafer 70 and the depth of a processing position to the piezoelectric element as the actuator 42. An aberration of the condensing point is thereby generated in the atmosphere such that the aberration of the condensing point of the pulsed laser beam LB is zero within the wafer 70.

Figure 5:
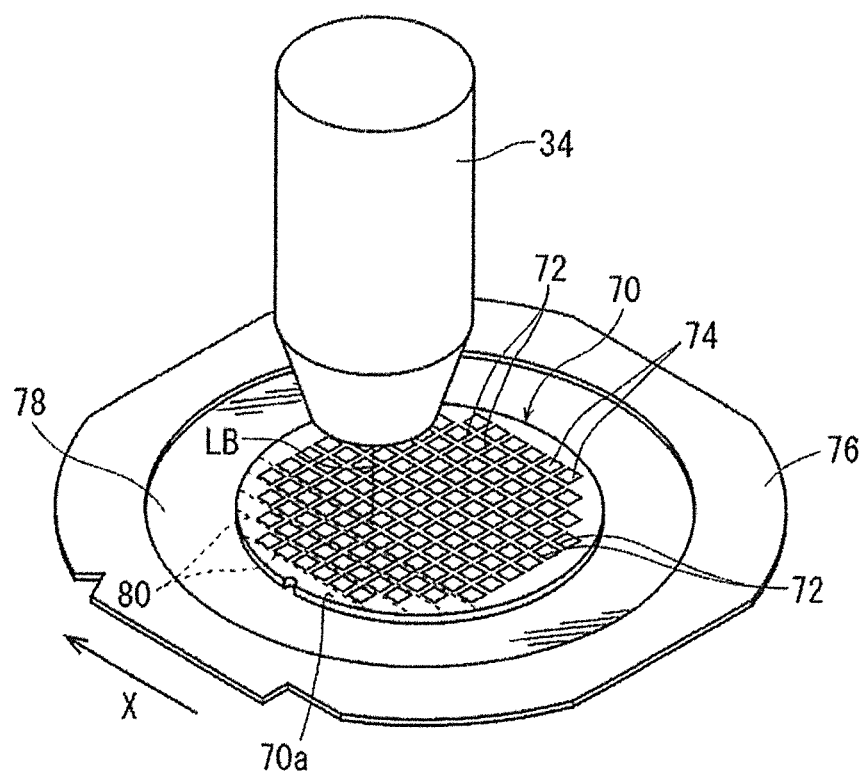
FIG. 5 is a perspective view depicting a state in which processing is performed within the wafer depicted in FIG. 4 by using the laser processing apparatus depicted in FIG. 1.

Next, the condensing point position adjusting unit 54 positions the condensing point inside the planned dividing line 72. Next, as depicted in FIG. 5, modified layer formation processing is performed which applies a pulsed laser beam LB of a wavelength transmissible through the wafer 70 from the condenser 34 to the wafer 70 while the X-axis direction moving unit 56 moves the chuck table 20 in the X-axis direction with respect to the condensing point at a predetermined feed speed. In the present embodiment, the aberration of the condensing point is zero within the wafer 70. Thus, a modified layer 80 serving as a starting point of division can be formed excellently along the planned dividing line 72 within the wafer 70 by performing the modified layer formation processing. Next, the Y-axis direction moving unit 58 index-feeds the chuck table 20 in the Y-axis direction with respect to the condensing point by an amount corresponding to an interval between the planned dividing lines 72. Then, all of the planned dividing lines 72 aligned with the X-axis direction are subjected to the modified layer formation processing by alternately repeating the modified layer formation processing and the index-feeding. In addition, all of the planned dividing lines 72 orthogonal to the planned dividing lines 72 previously subjected to the modified layer formation processing are also subjected to the modified layer formation processing by rotating the chuck table 20 by 90 degrees by the rotating unit and then alternately repeating the modified layer formation processing and the index-feeding. The modified layer 80 is consequently formed along the planned dividing lines 72 in the form of a lattice.

Such a processing method can be performed under the following processing conditions in a case where the wafer 70 is formed of Si (silicon) having an index of refraction of 3.5, for example. Incidentally, a standard position in the following is a position of the convex lens at which position the aberration of the condensing point of the laser beam is zero in the atmosphere.

Wavelength of the pulsed laser beam: 1064 nm
Repetition frequency: 10 kHz
Average power: 1.0 W
Numerical aperture (NA) of the condensing lens: 0.7
Feed speed: 100 mm/second
Condenser: generates an aberration of 28 μm in the atmosphere by moving the convex lens away from the concave lens by 168 μm from the standard position
Position of the modified layer: a position at a depth of 450 μm from the top surface of the wafer In addition, in a case where the wafer 70 is formed of LiTaO$_3$ (lithium tantalate) having an index of refraction of 2.2, the modified layer 80 serving as a starting point of division can be formed along the planned dividing line 72 within the wafer 70 excellently by performing the above-described processing method under the following processing conditions.

Figure 6A:
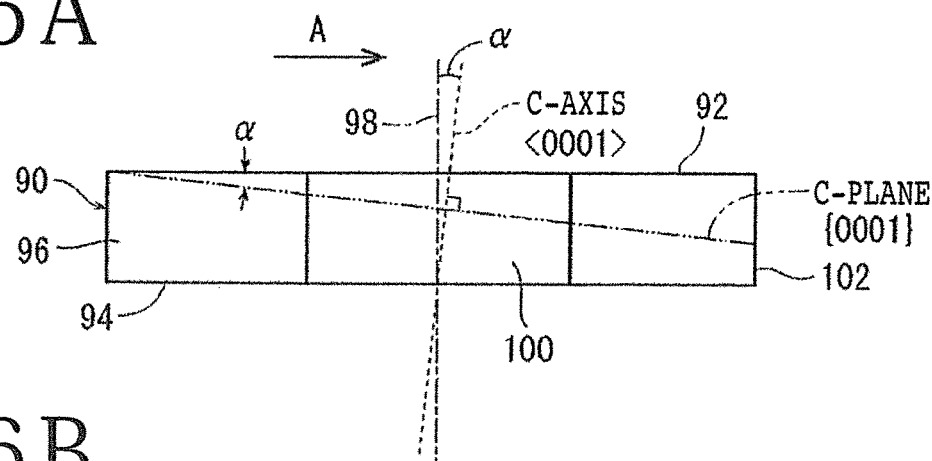
FIG. 6A is a front view of a SiC ingot.
Figure 6B:
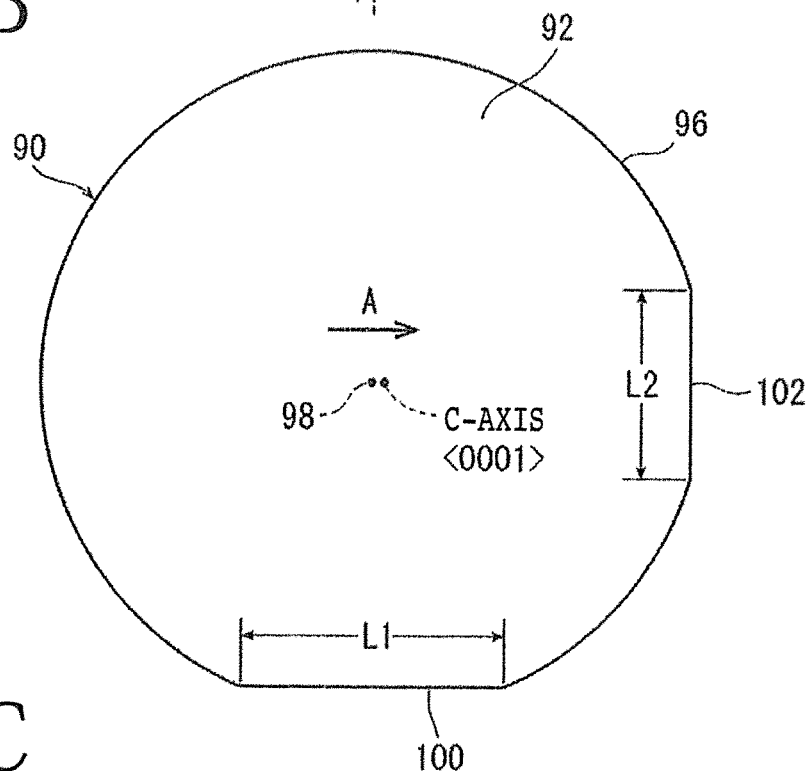
FIG. 6B is a plan view of the SiC ingot.
Figure 6C:
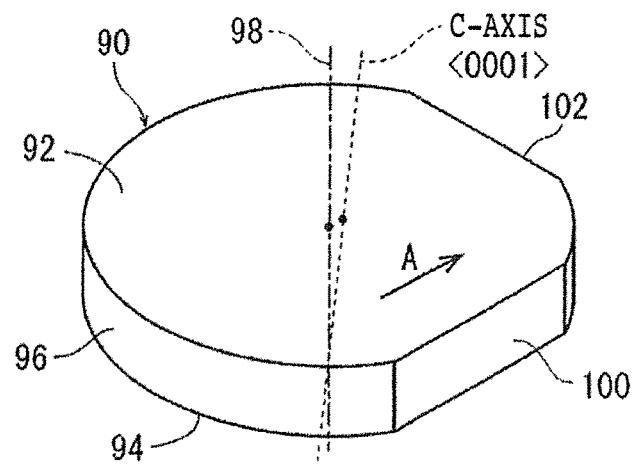
FIG. 6C is a perspective view of the SiC ingot.

Wavelength of the pulsed laser beam: 1064 nm
Repetition frequency: 10 kHz
Average power: 1.0 W
Numerical aperture (NA) of the condensing lens: 0.7
Feed speed: 100 mm/second
Condenser: generates an aberration of 45 μm in the atmosphere by moving the convex lens away from the concave lens by 270 μm from the standard position
Position of the modified layer: a position at a depth of 450 μm from the top surface of the wafer Further, when the laser processing apparatus 2 described above is used, a peeling layer for peeling off the wafer can be formed excellently within a SiC (silicon carbide) ingot. A SiC ingot 90 depicted in FIGS. 6A to 6C has an index of refraction of 2.6, and is formed of a hexagonal single crystal SiC and in a cylindrical shape as a whole. The SiC ingot 90 has a circular first surface 92, a circular second surface 94 on an opposite side from the first surface 92, a peripheral surface 96 located between the first surface 92 and the second surface 94, a c-axis (<0001> direction) extending from the first surface 92 to the second surface 94, and a c-plane ({0001} plane) orthogonal to the c-axis. In the SiC ingot 90, the c-axis is inclined with respect to a normal 98 to the first surface 92, and an off angle α (for example α=1, 3, or 6 degrees) is formed between the c-plane and the first surface 92. A direction in which the off angle α is formed is indicated by an arrow A in FIGS. 6A to 6C. A rectangular first orientation flat 100 and a rectangular second orientation flat 102 indicating a crystal orientation are formed on the peripheral surface 96. The first orientation flat 100 is parallel with the direction A in which the off angle α is formed. The second orientation flat 102 is orthogonal to the direction A in which the off angle α is formed. As depicted in FIG. 6B, as viewed from above, a length L2 of the second orientation flat 102 is shorter than a length L1 of the first orientation flat 100 (L2<L1). Incidentally, the SiC ingot that can be processed by the laser processing apparatus 2 may be a SiC ingot in which the c-axis is not inclined with respect to the normal to the first surface and thus the off angle between the c-plane and the first surface is 0 degrees (that is, the normal to the first surface and the c-axis coincide with each other).

Figure 7A:
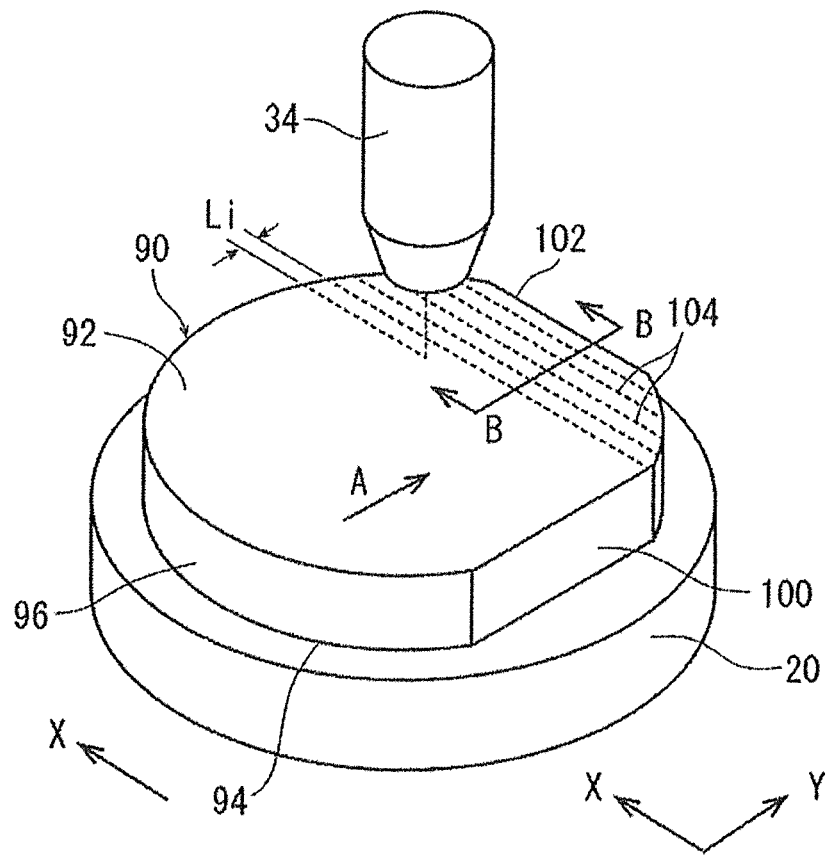
FIG. 7A is a perspective view depicting a state in which processing is performed within the SiC ingot depicted in FIG. 6C by using the laser processing apparatus depicted in FIG. 1.
Figure 7B:
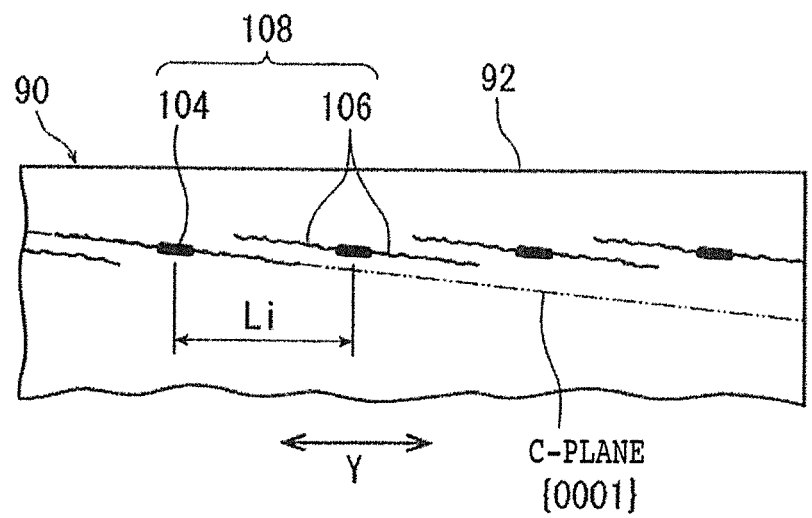
FIG. 7B is a sectional view taken along a line B-B in FIG. 7A.

When a peeling layer is formed within the SiC ingot 90 by using the laser processing apparatus 2, first, the SiC ingot 90 is sucked to the upper surface of the chuck table 20, and the imaging unit 36 images the SiC ingot 90 from above. Next, by moving and rotating the chuck table 20 by the X-axis direction moving unit 56, the Y-axis direction moving unit 58, and the rotating unit on the basis of an image of the SiC ingot 90 imaged by the imaging unit 36, the orientation of the SiC ingot 90 is adjusted to a predetermined orientation, and the positions of the SiC ingot 90 and the condenser 34 in an XY plane are adjusted. When the orientation of the SiC ingot 90 is adjusted to a predetermined orientation, a direction orthogonal to the direction A in which the off angle α is formed is aligned with the X-axis direction by aligning the second orientation flat 102 with the X-axis direction, as depicted in FIG. 7A. Next, the distance of the convex lens 40 with respect to the concave lens 38 is changed by applying an appropriate voltage based on the index of refraction of the SiC ingot 90 and the depth of a processing position to the piezoelectric element as the actuator 42. An aberration of the condensing point is thereby generated in the atmosphere such that the aberration of the condensing point of the pulsed laser beam LB is zero within the SiC ingot 90.

Next, the condensing point position adjusting unit 54 positions the condensing point at a depth corresponding to the thickness of a wafer to be produced from an upward end surface of the SiC ingot 90 (which upward end surface is the first surface 92 in the present embodiment). Next, peeling layer formation processing is performed which applies a pulsed laser beam LB of a wavelength transmissible through the SiC ingot 90 from the condenser 34 to the SiC ingot 90 while the X-axis direction moving unit 56 moves the chuck table 20 with respect to the condensing point at a predetermined feed speed in the X-axis direction aligned with the direction orthogonal to the direction A in which the off angle α is formed. In the present embodiment, the aberration of the condensing point is zero within the SiC ingot 90. It is therefore possible to excellently form a linear modified layer 104, which is formed when SiC is separated into Si (silicon) and C (carbon) by the application of the pulsed laser beam LB, the pulsed laser beam LB applied next is absorbed by C formed previously, and SiC is separated into Si and C in a chained manner, and cracks 106 that extend from the modified layer 104 along the c-plane on both sides of the modified layer 104.

Next, the Y-axis direction moving unit 58 index-feeds the chuck table 20 by a predetermined index amount Li with respect to the condensing point in the Y-axis direction aligned with the direction A in which the off angle α is formed. Then, the peeling layer formation processing and the index-feeding are repeated alternately. As a result, a plurality of linear modified layers 104 extending along the direction orthogonal to the direction A in which the off angle α is formed are formed at intervals of the predetermined index amount Li in the direction A in which the off angle α is formed, and a crack 106 and another crack 106 adjacent to each other in the direction A in which the off angle α is formed are made to overlap each other. It is thereby possible to form a peeling layer 108 for peeling off a wafer from the SiC ingot 90, the peeling layer 108 being formed of the plurality of modified layers 104 and cracks 106, at a depth corresponding to the thickness of the wafer to be produced from the upper end surface of the SiC ingot 90.

Such a processing method can be performed under the following processing conditions, for example.

Wavelength of the pulsed laser beam: 1064 nm
Repetition frequency: 80 kHz
Average power: 3.2 W
Numerical aperture (NA) of the condensing lens: 0.7
Index amount: 250 to 400 mm
Feed speed: 120 to 260 mm/second
Condenser: generates an aberration of 35 μm in the atmosphere by moving the convex lens away from the concave lens by 237 μm from the standard position
Position of the peeling layer: a position at a depth of 450 μm from the end surface of the SiC ingot Incidentally, the above description has been made of an example in which the SiC ingot 90 is moved relative to the condensing point in the direction orthogonal to the direction A in which the off angle α is formed in the peeling layer formation processing, and the SiC ingot 90 is moved relative to the condensing point in the direction A in which the off angle α is formed in the index-feeding. However, the direction of relative movement of the SiC ingot 90 with respect to the condensing point in the peeling layer formation processing may not be the direction orthogonal to the direction A in which the off angle α is formed, and the direction of relative movement of the SiC ingot 90 with respect to the condensing point in the index-feeding may not be the direction A in which the off angle α is formed.

As described above, in the present embodiment, the condenser 34 includes: the concave lens 38; the convex lens 40 disposed at a predetermined interval from the concave lens 38 and disposed at a position such that the aberration of the condensing point is zero in the atmosphere; and the actuator 42 that generates an aberration at the condensing point in the atmosphere by changing the distance of the convex lens 40 with respect to the concave lens 38. The actuator 42 is configured to generate the aberration in the atmosphere such that the aberration of the condensing point is zero within the workpiece. Excellent processing can therefore be performed within the workpiece.

Incidentally, in the description of the formation of a modified layer within the wafer 70, description has been made of an example in which the top surface 70a of the wafer 70 is directed upward, and the pulsed laser beam LB is applied from the top surface 70a to the wafer 70. However, the undersurface 70b of the wafer 70 may be directed upward, and the pulsed laser beam LB may be applied from the undersurface 70b to the wafer 70. In the case where the undersurface 70b of the wafer 70 is directed upward and the pulsed laser beam LB is applied from the undersurface 70b to the wafer 70, an imaging unit having an infrared camera images the planned dividing lines 72 of the top surface 70a through the undersurface 70b of the wafer 70, and positioning (alignment) is performed between a planned dividing line 72 and the condenser 34.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:
a chuck table configured to hold a workpiece;
a laser irradiating unit configured to perform processing by positioning, within the workpiece, a condensing point of a laser beam of a wavelength transmissible through the workpiece held by the chuck table, and irradiating the workpiece with the laser beam; and
a processing feed unit configured to perform processing feed of the chuck table and the laser irradiating unit relative to each other;
the laser irradiating unit including a laser oscillator configured to oscillate the laser beam and a condenser configured to condense the laser beam oscillated by the laser oscillator;
the condenser including a concave lens, a convex lens disposed at a predetermined interval from the concave lens, and disposed at a position such that aberration of the condensing point is zero in an atmosphere, and
an actuator configured to move the convex lens relative to the concave lens so as to generate an aberration at the condensing point in the atmosphere by changing a distance of the convex lens with respect to the concave lens;
the actuator generating the aberration in the atmosphere such that the aberration of the condensing point is zero within the workpiece.

2. The laser processing apparatus according to claim 1, wherein the actuator is formed by a piezoelectric element.

3. The laser processing apparatus according to claim 1, further comprising a condensing point position adjusting unit that adjusts a position of said concave lens relative to said convex lens.

4. The laser processing apparatus according to claim 1, further comprising a controller connected to said concave lens, wherein said controller changes a vertical dimension between said concave lens and said convex lens assembly based on a magnitude of a voltage applied by said controller.

5. A laser processing apparatus comprising:
a chuck table configured to hold a workpiece;
a laser irradiating unit configured to perform processing by positioning, within the workpiece, a condensing point of a laser beam of a wavelength transmissible through the workpiece held by the chuck table, and irradiating the workpiece with the laser beam; and
a processing feed unit configured to perform processing feed of the chuck table and the laser irradiating unit relative to each other;
the laser irradiating unit including a laser oscillator configured to oscillate the laser beam and a condenser configured to condense the laser beam oscillated by the laser oscillator;
the condenser including a concave lens, a convex lens disposed at a predetermined interval from the concave lens, and disposed at a position such that aberration of the condensing point is zero in an atmosphere, and
an actuator including a piezoelectric element and a controller connected to the piezoelectric element to control a voltage applied to the piezoelectric element to move the convex lens relative to the concave lens so as to generate an aberration at the condensing point in the atmosphere by changing a distance of the convex lens with respect to the concave lens;
the actuator generating the aberration in the atmosphere such that the aberration of the condensing point is zero within the workpiece.

* * * * *